United States Patent
Frougier et al.

(10) Patent No.: US 10,388,732 B1
(45) Date of Patent: Aug. 20, 2019

(54) NANOSHEET FIELD-EFFECT TRANSISTORS INCLUDING A TWO-DIMENSIONAL SEMICONDUCTING MATERIAL

(71) Applicant: GLOBALFOUNDRIES Inc., Grand Cayman (KY)

(72) Inventors: Julien Frougier, Albany, NY (US); Ruilong Xie, Niskayuna, NY (US); Nicolas Loubet, Guilderland, NY (US); Kangguo Cheng, Schenectady, NY (US); Juntao Li, Cohoes, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/992,942

(22) Filed: May 30, 2018

(51) Int. Cl.
| | |
|---|---|
| *H01L 29/06* | (2006.01) |
| *H01L 29/786* | (2006.01) |
| *H01L 29/08* | (2006.01) |
| *H01L 29/423* | (2006.01) |
| *H01L 29/24* | (2006.01) |
| *H01L 29/16* | (2006.01) |
| *H01L 21/02* | (2006.01) |
| *H01L 21/04* | (2006.01) |
| *H01L 29/66* | (2006.01) |
| *H01L 21/423* | (2006.01) |
| *H01L 21/441* | (2006.01) |
| *H01L 29/10* | (2006.01) |

(52) U.S. Cl.
CPC ...... *H01L 29/0673* (2013.01); *H01L 21/0262* (2013.01); *H01L 21/02527* (2013.01); *H01L 21/02568* (2013.01); *H01L 21/041* (2013.01); *H01L 21/044* (2013.01); *H01L 21/423* (2013.01); *H01L 21/441* (2013.01); *H01L 29/0649* (2013.01); *H01L 29/0847* (2013.01); *H01L 29/1033* (2013.01); *H01L 29/1606* (2013.01); *H01L 29/24* (2013.01); *H01L 29/42392* (2013.01); *H01L 29/66045* (2013.01); *H01L 29/66969* (2013.01); *H01L 29/78684* (2013.01); *H01L 29/78696* (2013.01)

(58) Field of Classification Search
None
See application file for complete search history.

(56) References Cited

U.S. PATENT DOCUMENTS

| | | |
|---|---|---|
| 2011/0092030 A1 | 4/2011 | Or-Bach et al. |
| 2011/0121366 A1 | 5/2011 | Or-Bach et al. |

(Continued)

OTHER PUBLICATIONS

Lembke, Dominik, and Andras Kis. "Breakdown of High-Performance Monolayer MoS2 Transistors." ACS Nano, vol. 6, No. 11, 2012, pp. 10070-10075., doi:10.1021/nn303772b. (Year: 2012).*

(Continued)

*Primary Examiner* — J. E. Schoenholtz
(74) *Attorney, Agent, or Firm* — Thompson Hine LLP; Anthony Canale

(57) ABSTRACT

Structures for a field-effect transistor and methods of forming structures for a field-effect transistor. A plurality of channel layers are arranged in a layer stack, and a source/drain region is connected with the plurality of channel layers. A gate structure includes a plurality of sections that respectively surround the plurality of channel layers. The plurality of channel layers contain a two-dimensional semiconducting material.

20 Claims, 8 Drawing Sheets

(56) References Cited

U.S. PATENT DOCUMENTS

2012/0129301 A1     5/2012  Or-Bach et al.
2015/0364592 A1*   12/2015  van Dal ................ H01L 29/785
                                                            257/29
2017/0069481 A1*    3/2017  Doris .................. H01L 21/0228

OTHER PUBLICATIONS

Liao, Lei, et al. "Sub-100 Nm Channel Length Graphene Transistors." Nano Letters, vol. 10, No. 10, 2010, pp. 3952-3956., doi: 10.1021/nl101724k. (Year: 2010).*
Chen et al., "Stable few-layer MoS2 rectifying diodes formed by plasma-assisted doping", Applied Physics Letters 103, 142110 (2013).
Wi et al., "Enhancement of Photovoltaic Response in Multilayer MoS2 Induced by Plasma Doping" © 2014 American chemical Society, vol. 8, No. 5, 5270-5281.
Nipane et al., "Few-Layer MoS2 p-Type Devices Enabled by Selective Doping Using Low Energy Phosphorus Implantation", © 2016 American Chemical Society, ACS Nano 2016, 10, 2128-2137.

\* cited by examiner

NANOSHEET FIELD-EFFECT TRANSISTORS INCLUDING A TWO-DIMENSIONAL SEMICONDUCTING MATERIAL

BACKGROUND

The present invention relates to semiconductor device fabrication and integrated circuits and, more specifically, to structures for a field-effect transistor and methods of forming a structure for a field-effect transistor.

Device structures for a field-effect transistor generally include a source, a drain, and a gate electrode configured to switch carrier flow in a channel formed in a semiconductor body arranged between the source and drain. The semiconductor body and channel of a planar field-effect transistor are arranged beneath the top surface of a substrate on which the gate electrode is supported. When a control voltage exceeding a designated threshold voltage is applied to the gate electrode, the flow of carriers in the channel produces a device output current.

Nanosheet field-effect transistors have been developed as a type of non-planar field-effect transistor that may permit additional increases in packing density in an integrated circuit. The body of a nanosheet field-effect transistor includes multiple nanosheet channel layers that are arranged in a layer stack. The nanosheet channel layers are initially arranged in a layer stack with sacrificial layers containing a material (e.g., silicon-germanium) that can be etched selectively to the material (e.g., silicon) constituting the nanosheet channel layers. The sacrificial layers are etched and removed in order to release the nanosheet channel layers and to provide spaces for the formation of a gate stack. Sections of the gate stack may surround all sides of the individual nanosheet channel layers in a gate-all-around arrangement.

Nanosheet field-effect transistors may encounter difficulty in scaling because thinning silicon nanosheet channel layers may reach a thickness at which quantum confinement effects degrade performance. In addition, short channel effects may limit the ability to continue to shrink the gate length. As such, limits over electrostatic control for nanosheet field-effect transistors having silicon nanosheet channel layers may limit scaling.

SUMMARY

In embodiments of the invention, a structure is provided for a field-effect transistor. The structure includes a plurality of channel layers arranged in a layer stack, a source/drain region connected with the plurality of channel layers, and a gate structure including a plurality of sections that respectively surround the plurality of channel layers. The plurality of channel layers are comprised of a two-dimensional semiconducting material.

In embodiments of the invention, a method is provided for forming a field-effect transistor. The method includes forming a plurality of nanosheet channel layers arranged in a layer stack, and forming a gate structure including a plurality of sections that respectively surround the plurality of nanosheet channel layers. After forming the gate structure, the plurality of nanosheet channel layers are removed to form a plurality of spaces between the plurality of sections of the gate structure. The method further includes depositing a two-dimensional semiconducting material in the plurality of spaces between the plurality of sections of the gate structure to form a plurality of replacement channel layers.

BRIEF DESCRIPTION OF THE DRAWINGS

The accompanying drawings, which are incorporated in and constitute a part of this specification, illustrate various embodiments of the invention and, together with a general description given above and the detailed description given below, serve to explain the embodiments of the invention.

DETAILED DESCRIPTION

Figure 1:
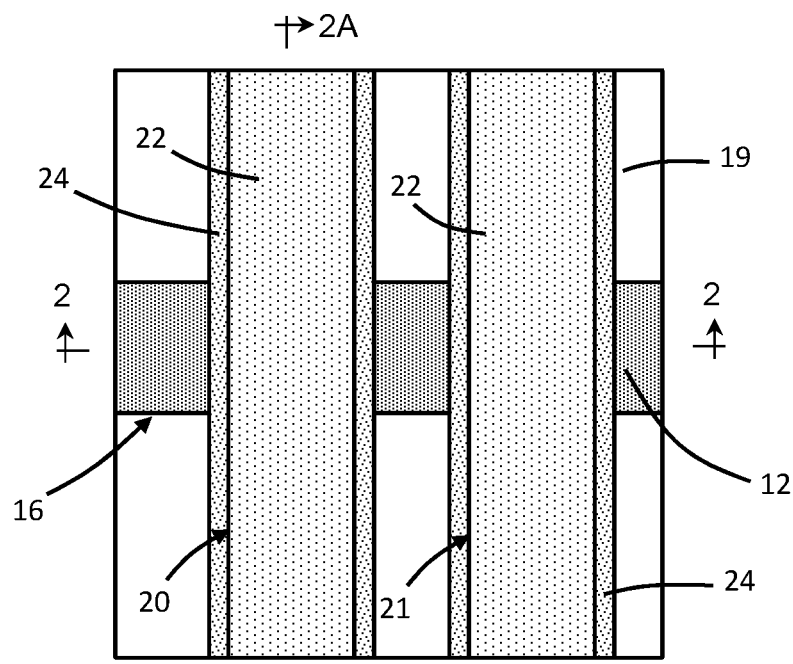
FIG. 1 is a top view of a device structure at an initial fabrication stage of the processing method in accordance with embodiments of the invention.
Figure 2:
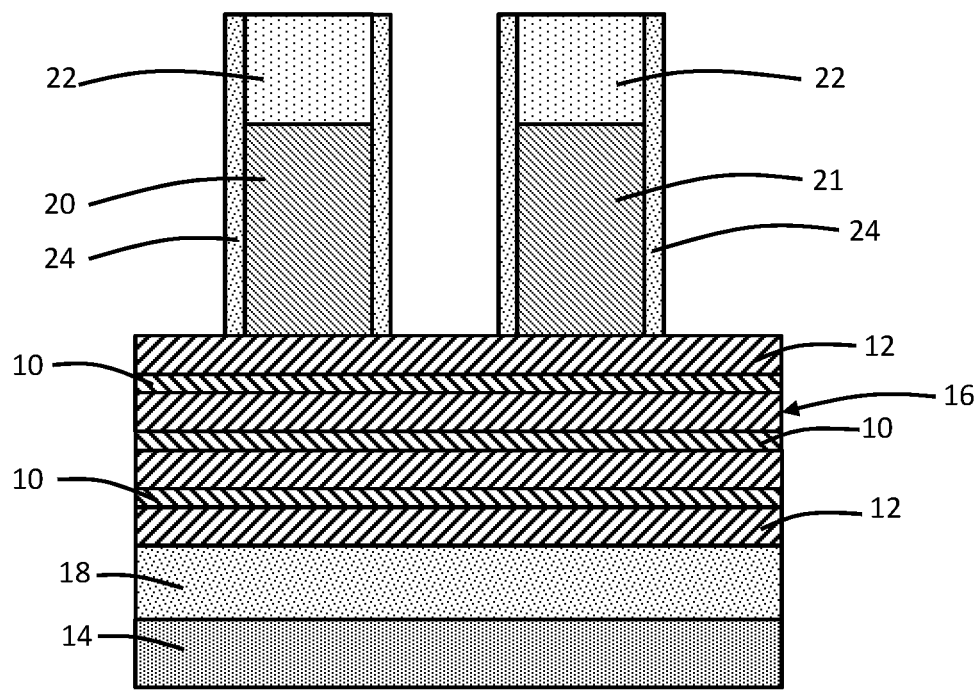
FIG. 2 is a cross-sectional view taken generally along line 2-2 in FIG. 1.
Figure 2A:
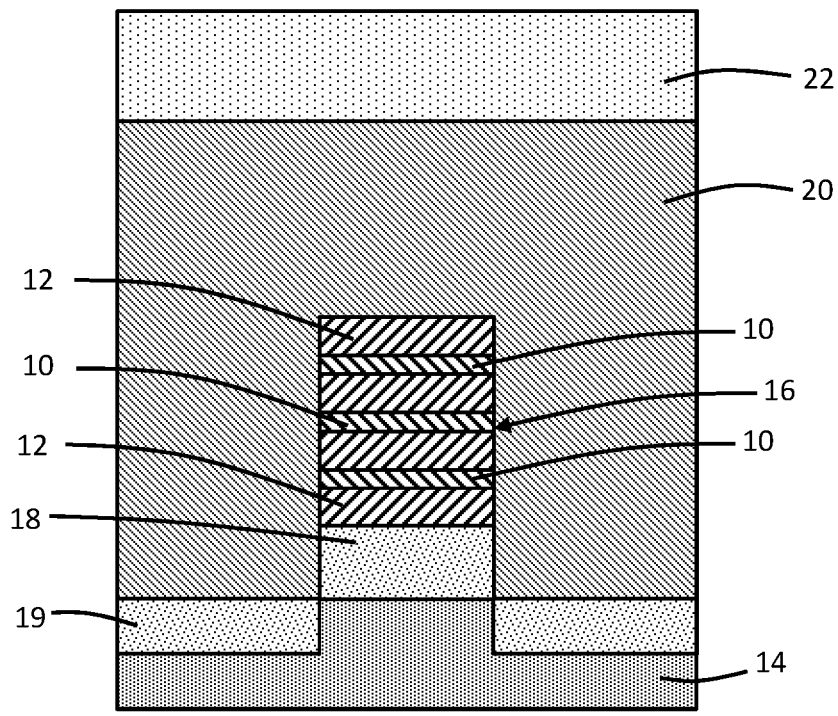
FIG. 2A is a cross-sectional view taken generally along line 2A-2A in FIG. 1.

With reference to FIGS. 1, 2, 2A and in accordance with embodiments of the invention, nanosheet channel layers 10 and sacrificial layers 12 are arranged in a patterned layer stack 16 on a substrate 14. The substrate 14 may be composed of a semiconductor material, such as single-crystal silicon. The nanosheet channel layers 10 and sacrificial layers 12 may be formed on the substrate 14 by an epitaxial growth process during which the composition is alternated as the layers 10, 12 are formed, and may be patterned using a lithography and etching process to form the layer stack 16. The number of nanosheet channel layers 10 and sacrificial layers 12 in the layer stack 16 may differ from the number in the depicted representative embodiment and, in particular, may be greater than the number in the representative embodiment through the addition of pairs of nanosheet channel layers 10 and sacrificial layers 12 to the patterned layer stack 16. The nanosheet channel layers 10 and sacrificial layers 12 may be used to form a nanosheet field-effect transistor of a given conductivity type, such as a p-type nanosheet field-effect transistor or an n-type nanosheet field-effect transistor.

The nanosheet channel layers 10 are composed of a semiconductor material, and the sacrificial layers 12 are composed of a semiconductor material with a composition that is selected to be removed selective to the semiconductor material of the nanosheet channel layers 10. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The respective compositions of the layers 10, 12 are selected during epitaxial growth. In an embodiment, the semiconductor material constituting the nanosheet channel layers 10 may be silicon (Si), and the semiconductor material constituting the sacrificial layers 12 may be silicon-germanium (SiGe) that etches at a higher rate than silicon due to the germanium content. In an embodiment, the germanium content of the sacrificial layers 12 may range from twenty percent (25%) to thirty-five percent (35%).

The nanosheet channel layers 10 are thinner than the sacrificial layers 12. In that regard, the thickness, t1, of the nanosheet channel layers 10 is less than the thickness, t2, of the sacrificial layers 12. Unlike conventional constructions for a nanosheet field-effect transistor, the nanosheet channel layers 10 are sacrificial and therefore are not present in the completed device structure. The reduced thickness of the nanosheet channel layers 10 promotes their replacement with layers of a semiconducting material that are thinner than the nanosheet channel layers 10 in conventional nanosheet field-effect transistors.

A dielectric layer 18 is arranged beneath the patterned layer stack 16 such that the layer stack 16 is electrically isolated from the substrate 14. Dielectric materials suitable for the dielectric layer 18 include, but are not limited to, silicon dioxide ($SiO_2$), SiBCN, SiOC, and SiOCN. The dielectric material of the dielectric layer 18 may replace a sacrificial layer (not shown) initially arranged between the layer stack 16 and the substrate 14 following epitaxial growth. Shallow trench isolation regions 19 are arranged in the substrate 14 around the patterned layer stack 16 and may be formed by a shallow trench isolation (STI) technique. Alternatively, instead of the substrate 14 being a bulk substrate, the substrate 14 may be a silicon-on-insulator (SOI) substrate, and the patterned layer stack 16 may be arranged directly on the buried oxide layer of the substrate 14 without the need for shallow trench isolation regions 19 or the formation of the dielectric layer 18.

Sacrificial gate structures 20, 21 are formed that overlap with and wrap around the patterned layer stack 16. The sacrificial gate structures 20, 21 have a spaced-apart arrangement along the length of the layer stack 16 and are aligned transverse to the layer stack 16. The sacrificial gate structures 20, 21 may include a thin oxide layer adjacent to the patterned layer stack 16 and a thicker layer containing a sacrificial material, such as amorphous silicon. The sacrificial gate structures 20, 21 are patterned from these constituent layers with reactive ion etching (ME) using a hardmask. The sacrificial gate structures 20, 21 may be cut along their lengths to define the locations of individual field-effect transistors and/or the sacrificial gate structures 20, 21 may overlap with additional layer stacks similar to layer stack 16. The sacrificial gate structures 20, 21 are covered by a hardmask cap 22 arranged on their respective top surfaces. The hardmask cap 22 may include one or more dielectric materials, such as a layered combination of silicon dioxide and silicon nitride, and may be a remnant of the hardmask from the lithography and etching process used to form the sacrificial gate structures 20, 21.

Sidewall spacers 24 are formed on the sidewalls of the sacrificial gate structures 20, 21. The sidewall spacers 24 may be formed by depositing a conformal layer of a dielectric material, such as SiBCN, and etching the conformal layer with a directional etching process, such as reactive ion etching (RIE).

Figure 3:
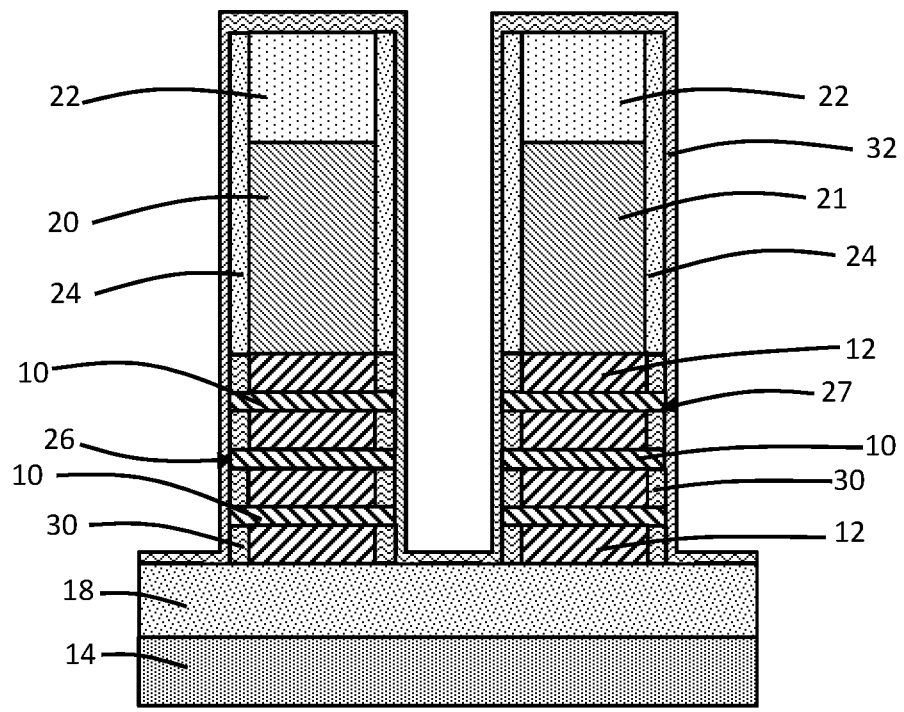
FIGS. 3-11 are cross-sectional views of the device structure at successive fabrication stages of the processing method subsequent to FIG. 2.

With reference to FIG. 3 in which like reference numerals refer to like features in FIG. 2 and at a subsequent fabrication stage of the processing method, the layer stack 16 is patterned to form body features 26, 27 that each include a layer stack of patterned nanosheet channel layers 10 and sacrificial layers 12. The layer stack 16 may be patterned by a self-aligned etching process in which the respective sacrificial gate structures 20, 21 operate as an etch mask. The self-aligned etching process, which may be a reactive ion etching (ME) process, may utilize one or more etch chemistries to etch the layer stack 16. The patterning completely removes the layer stack 16 from areas adjacent to the body features 26, 27 and sacrificial gate structure 20, 21. The stacked arrangement of the body feature 26 and sacrificial gate structure 20 is separated from the stacked arrangement of the body feature 27 and sacrificial gate structure 21 by a gap.

After forming the body features 26, 27, the sacrificial layers 12 are laterally recessed relative to the nanosheet channel layers 10 with a dry or wet isotropic etching process that etches the semiconductor material constituting the sacrificial layers 12 selective to the semiconductor material constituting the nanosheet channel layers 10. The lateral recessing of the sacrificial layers 12 generates indents in the sidewalls of the body features 26, 27 because the nanosheet channel layers 10 are not laterally recessed due to the etch selectivity of the isotropic etching process.

Inner spacers 30 are subsequently formed in the indents adjacent to the recessed ends of the sacrificial layers 12. The inner spacers 30 may be formed by depositing a conformal layer 32 composed of a dielectric material, such as silicon nitride ($Si_3N_4$) by atomic layer deposition (ALD), that fills the indents in the sidewalls of the body features 26, 27 by pinch-off. The conformal layer 32 coats the dielectric layer 18, the sacrificial gate structure 20, 21 and their hardmask caps 22, and the body features 26, 27. However, in contrast to a conventional process flow, the conformal layer 32 is not etched and removed outside of the indents.

Figure 4:
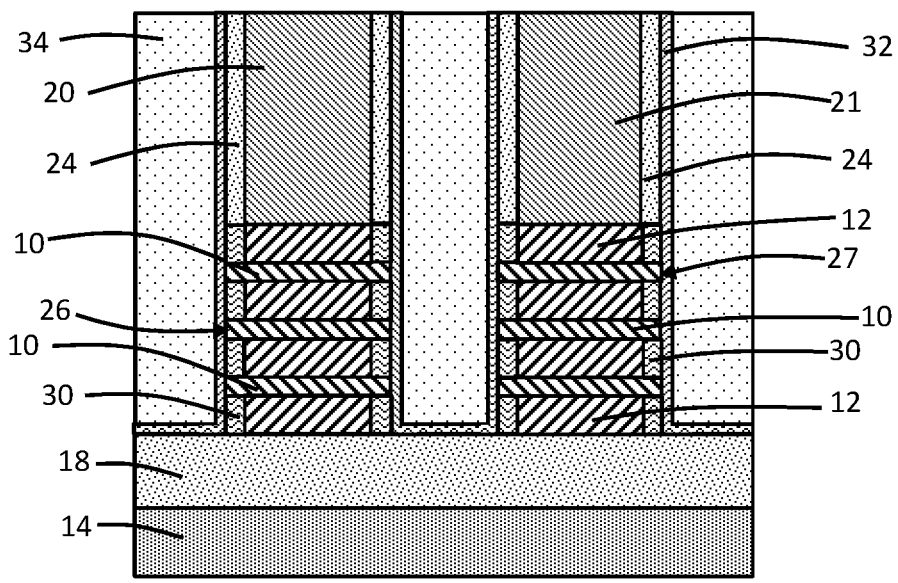

With reference to FIG. 4 in which like reference numerals refer to like features in FIG. 3 and at a subsequent fabrication stage of the processing method, an interlayer dielectric layer 34 is deposited and planarized by chemical mechanical polishing (CMP). The interlayer dielectric layer 34 may be composed of a dielectric material, such as silicon dioxide ($SiO_2$). A section of the interlayer dielectric layer 34 is located in the gap separating the sacrificial gate structure 20 and body feature 26 from the sacrificial gate structure 21 and body feature 27. The planarization may also remove the hardmask caps 22 from the sacrificial gate structures 20, 21 and thereby reveal the sacrificial gate structures 20, 21.

Figure 5:
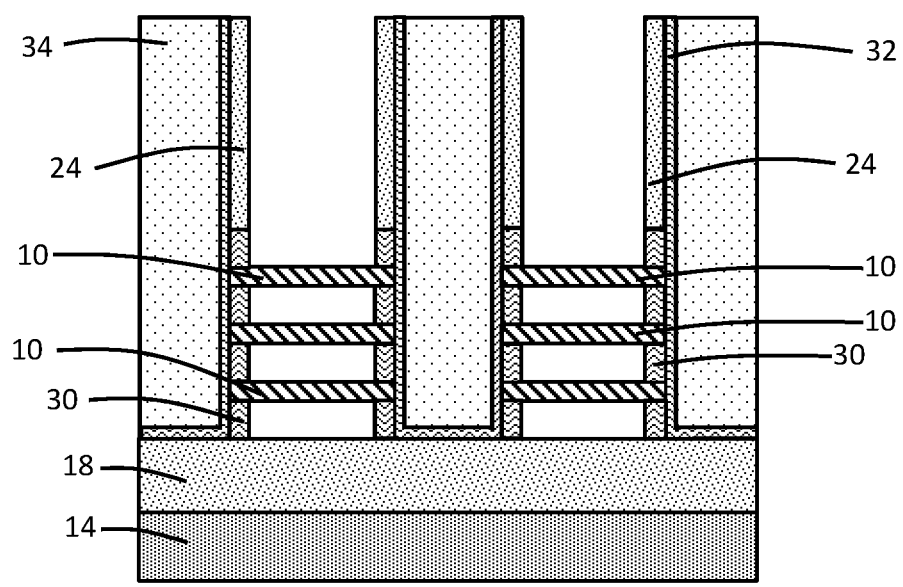

With reference to FIG. 5 in which like reference numerals refer to like features in FIG. 4 and at a subsequent fabrication stage of the processing method, the sacrificial material and thin oxide layer of the sacrificial gate structures 20, 21 are removed with one or more etching processes. The sacrificial layers 12 are subsequently removed with an etching process that removes the material of the sacrificial layers 12 selective to the materials of the nanosheet channel layers 10 and inner spacers 30. The etching process may be, for example, a wet SC1 etch or a dry vapor-phase HCl etch. The removal of the sacrificial layers 12 releases the nanosheet channel layers 10 and opens spaces surrounding the nanosheet channel layers 10 of each of the body features 26, 27. The nanosheet channel layers 10 are anchored at opposite ends by the inner spacers 30.

Figure 6:
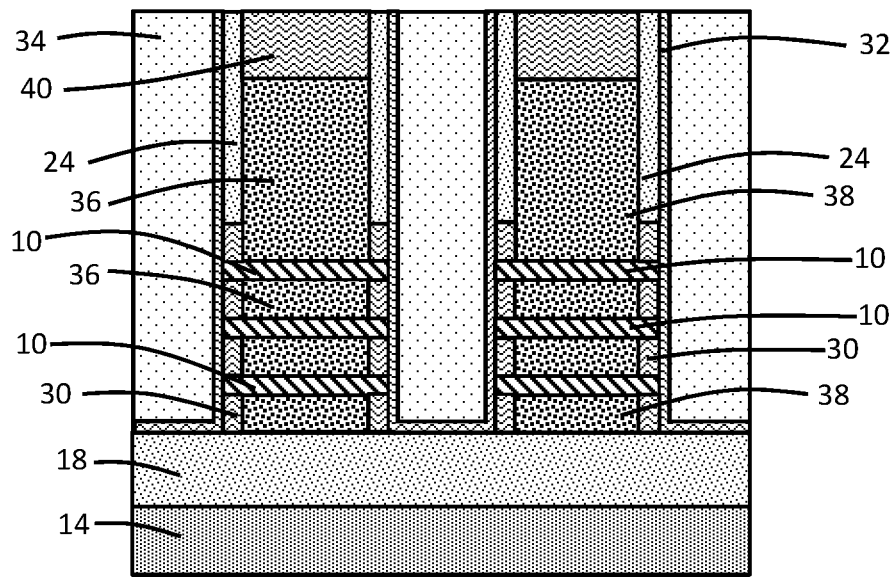
Figure 6A:
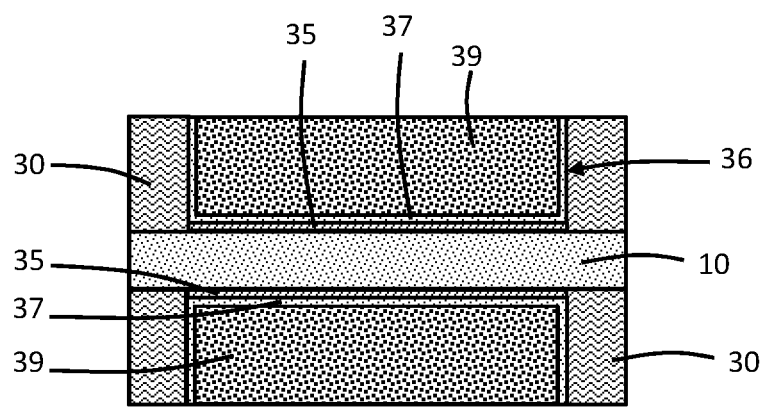
FIG. 6A is an enlarged view of a portion of FIG. 6.

With reference to FIGS. 6, 6A in which like reference numerals refer to like features in FIG. 5 and at a subsequent fabrication stage of the processing method, after removing the sacrificial gate structures 20 and removing the sacrificial layers 12 to release the nanosheet channel layers 10 of the body features 26, 27, gate structures 36, 38 are formed as part of a replacement gate process to fabricate a multiple-gate nanosheet field-effect transistor. Each of the gate structures 36, 38 may be formed from a gate stack that includes an interface layer 35, a gate dielectric layer 37, and a metal gate electrode 39. The interface layer 35 coats the exterior surfaces of the nanosheet channel layers 10, and the gate dielectric layer 37 is arranged in the gate stack between the metal gate electrode 39 and the interface layer 35. Sections of the gate structure 36 and sections of the gate structure 38 are located in the spaces formerly occupied by the removed sacrificial layers 12. These sections of the gate structures 36, 38 surround respective exterior surfaces of the nanosheet channel layers 10 of the different body features 26, 27 in a gate-all-around (GAA) arrangement. Self-aligned contact (SAC) caps 40 composed of a dielectric material, such as silicon nitride ($Si_3N_4$), are formed in the spaces between the sidewall spacers 24 over each of the gate structures 36, 38.

The interface layer 35 may be composed of a dielectric material, such as an oxide of silicon (e.g., silicon dioxide ($SiO_2$)). The gate dielectric layer 37 may be composed of a dielectric material, such as a high-k dielectric material like hafnium oxide ($HfO_2$). The metal gate electrode 39 includes one or more conformal barrier metal layers and/or work function metal layers, such as layers composed of titanium aluminum carbide (TiAlC) and/or titanium nitride (TiN), and a metal gate fill layer composed of a conductor, such as tungsten (W). The metal gate electrode 39 may include different combinations of the conformal barrier metal layers and/or work function metal layers. For example, the metal gate electrode 39 may include conformal work function metal layers characteristic of a p-type nanosheet field-effect transistor. As another example, the metal gate electrode 39 may include conformal work function metal layers characteristic of an n-type nanosheet field-effect transistor.

Figure 7:
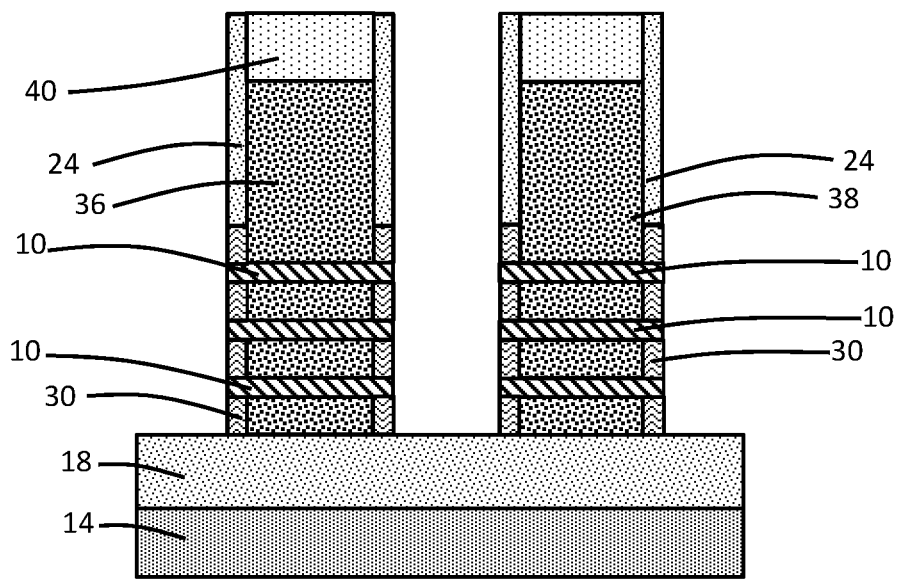

With reference to FIG. 7 in which like reference numerals refer to like features in FIG. 6 and at a subsequent fabrication stage of the processing method, the interlayer dielectric layer 34 is removed with an etching process, which exposes the conformal layer 32. The exposed conformal layer 32 is removed with an etching process, such as a wet chemical etching process using a heated solution containing phosphoric acid ($H_3PO_4$), which leaves the inner spacers 30 filling the indents in the sidewalls of the body features 26, 27. The removal of the conformal layer 32 exposes the exterior surfaces of the nanosheet channel layers 10.

Figure 8:
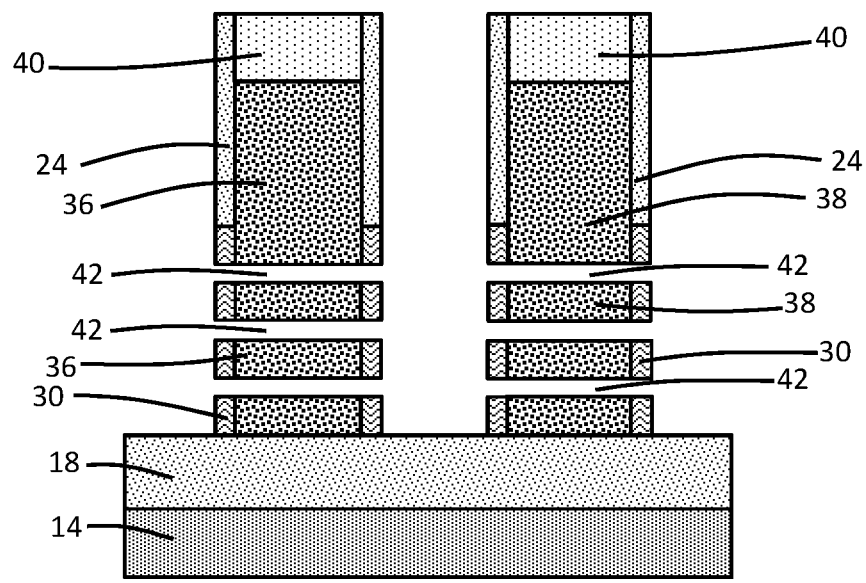

With reference to FIG. 8 in which like reference numerals refer to like features in FIG. 7 and at a subsequent fabrication stage of the processing method, the nanosheet channel layers 10 are removed with an etching process that remove the nanosheet channel layers 10 selective to the material of the interface layer 35 of the gate structures 36, 38. For example, the etching process may be a remote plasma-assisted dry etch process (e.g., a Frontier etch) that exposes the nanosheet channel layers 10 to radicals (i.e., uncharged or neutral species) generated from a gas mixture of nitrogen triflouride ($NF_3$) and hydrogen ($H_2$). The removal of the nanosheet channel layers 10 forms spaces 42 that are arranged between the sections of the gate structures 36, 38. The spaces 42 have a height that is equal to the thickness of the removed nanosheet channel layers 10. In an embodiment, the height of the spaces 42 may be on the order of one (1) nanometer to three (3) nanometers.

Figure 9:
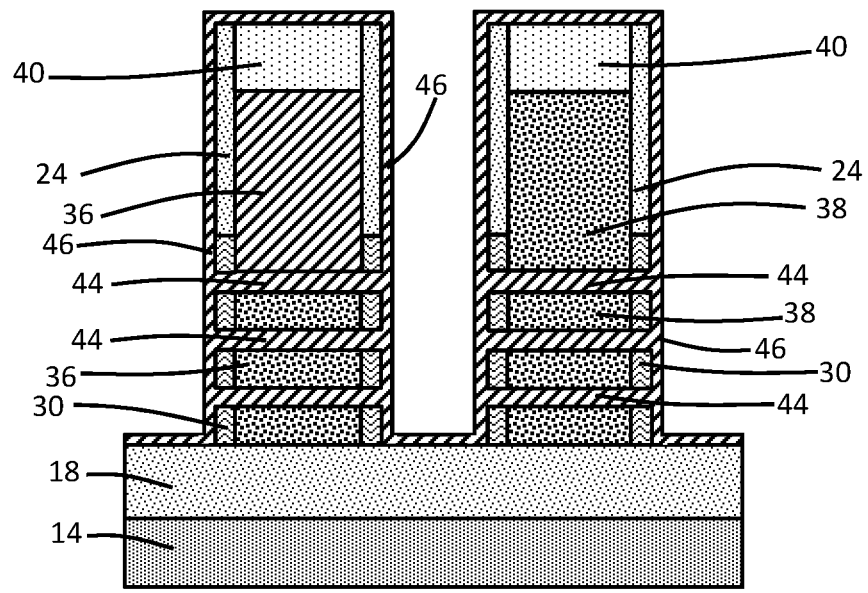
Figure 9A:
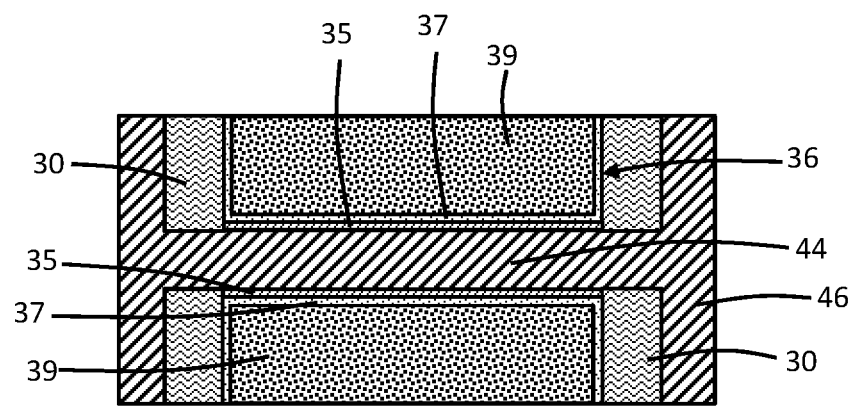
FIG. 9A is an enlarged view of a portion of FIG. 9.

With reference to FIGS. 9, 9A in which like reference numerals refer to like features in FIG. 8 and at a subsequent fabrication stage of the processing method, a two-dimensional (2D) semiconducting material is conformally deposited that at least partially fills the spaces 42 to form replacement channel layers 44 that are surrounded by the sections of the gate structures 36, 38 and that forms a continuous layer 46 that wraps about the sidewall spacers 24, the inner spacers 30, and the caps 40, as well as forms on the dielectric layer 18. The replacement channel layers 44 contain portions of the 2D semiconducting material that are deposited in the spaces 42 on the interface layer 35 of the gate structures 36, 38. In an embodiment, the 2D semiconducting material completely fills the spaces 42 to form the replacement channel layers 44 such that the replacement channel layers 44 have a thickness equal to the height of the spaces 42, which is on the order of one (1) nanometer to three (3) nanometers.

The 2D semiconducting material may be a thin conformal coating that is deposited by, for example, atomic layer deposition (ALD) or chemical vapor deposition (CVD), preferably at a temperature of less than 500° C. (e.g., within a range of 450° C. to 500° C.) to avoid metal diffusion in the gate structures 36, 38. In an embodiment, the 2D semiconducting material may be composed of a transition metal dichalcogenide that includes a transition metal (e.g., molybdenum (Mo) or tungsten (W)) and a chalcogen atom (sulphur (S), selenium (Se), or tellurium (Te)). Exemplary transition metal dichalcogenides include, but are not limited to, molybdenum disulphide ($MoS_2$), hafnium disulfide ($HfS_2$), zirconium disulfide ($ZrS_2$), tungsten disulfide ($WS_2$), tin sulfide (SnS), and tungsten diselenide ($WSe_2$). In an alternative embodiment, the 2D semiconducting material may be composed of graphene (C). In an alternative embodiment, the 2D semiconducting material may be characterized by a carrier mobility that is greater than the carrier mobility of silicon. The 2D semiconducting material and, in particular, the 2D semiconducting material contained in each of the replacement channel layers 44 may include a single monolayer of atoms arranged in a thin sheet.

The 2D semiconducting material in the layer 46 may be doped to increase its electrical conductivity. In an embodiment, the 2D semiconducting material in the layer 46 may be doped following its deposition. In an embodiment, the 2D semiconducting material in the layer 46 may be doped by a non-destructive process, such as by a plasma doping process. In an embodiment, the 2D semiconducting material in the layer 46 may be doped with a p-type dopant from Group III of the Periodic Table (e.g., boron (B), aluminum (Al), gallium (Ga), and/or indium (In)) that provides p-type electrical conductivity. In an embodiment, the 2D semiconducting material in the layer 46 may be doped with an n-type dopant from Group V of the Periodic Table (e.g., phosphorus (P) and/or arsenic (As)) that provides n-type electrical conductivity.

Figure 9B:
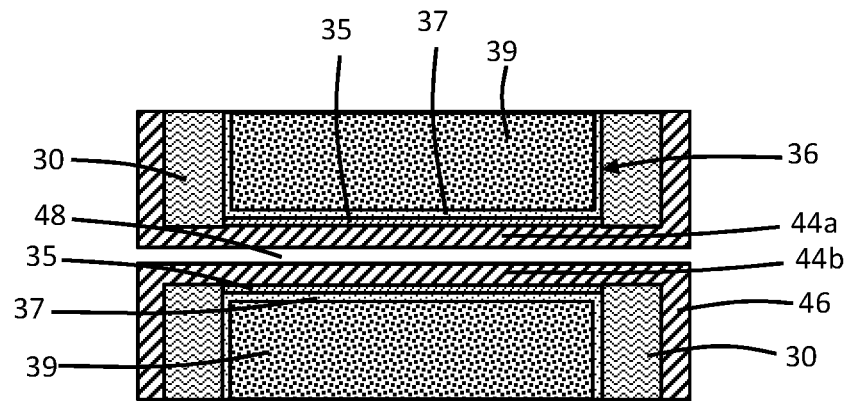
FIG. 9B is an enlarged view similar to FIG. 9A of a device structure fabricated by a processing method in accordance with alternative embodiments of the invention.

In an alternative embodiment and as shown in FIG. 9B, the deposited thickness of the 2D semiconducting material may be controlled such that the spaces 42 are only partially filled by the 2D semiconducting material. The 2D semiconducting material inside each of the spaces 42 forms sections 44a, 44b constituting a replacement channel layer. The sections 44a, 44b of 2D semiconducting material form on the interface layers 35 covering the sections of the gate structures 36 and 38 that are arranged above and below the spaces 42. In an embodiment, each of the sections 44a, 44b of the 2D semiconducting material may include a single monolayer of atoms arranged in a thin sheet. The 2D semiconducting material in the sections 44a, 44b of each replacement channel layer are separated in a vertical direction by an air gap 48 resulting from the partial filling of the spaces 42. As a result, a portion of each space 42 includes one of the air gaps 48.

Figure 9C:
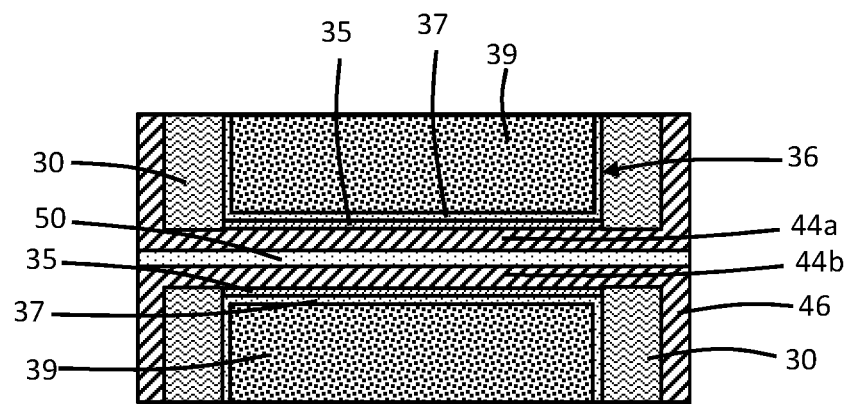
FIG. 9C is an enlarged view similar to FIG. 9A of a device structure fabricated by a processing method in accordance with alternative embodiments of the invention.

In an alternative embodiment and as shown in FIG. 9C, the deposited thickness of the 2D semiconducting material may be controlled such that the spaces 42 are partially filled by the 2D semiconducting material. The 2D semiconducting material inside each of the spaces 42 forms sections 44a, 44b of a replacement channel layer. The sections 44a, 44b of 2D semiconducting material form on the interface layers 35 covering the sections of the gate structures 36 and 38 that are arranged above and below the spaces 42. In an embodiment, each of the sections 44a, 44b of the 2D semiconducting material may include a single monolayer of atoms arranged in a thin sheet. A dielectric layer 50 may be formed in a portion of each space 42 that separates the sections 44a, 44b of each replacement channel layer. The dielectric layer 50 may be composed of a dielectric material, such as $SiO_2$, SiOC, SiOCN, SiBCN, etc.

Figure 10:
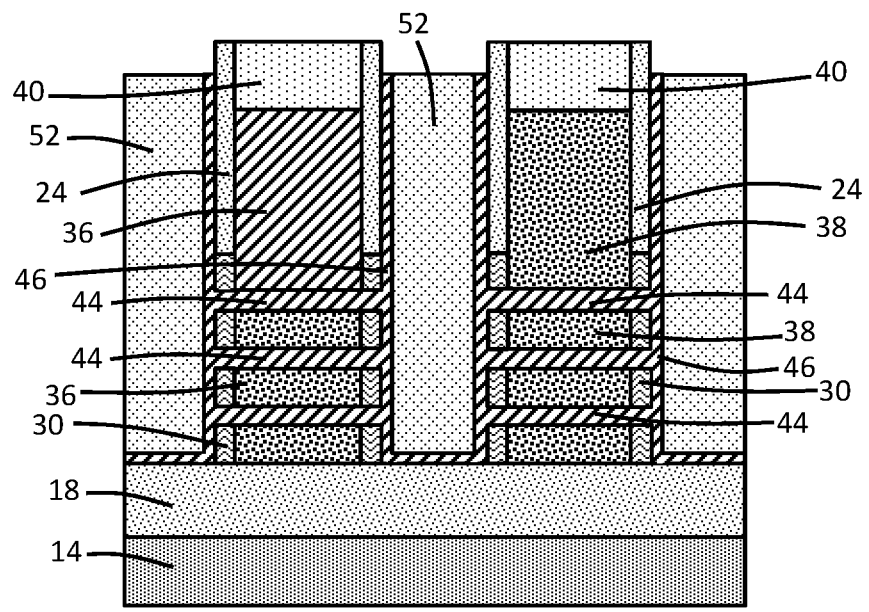

With reference to FIG. 10 in which like reference numerals refer to like features in FIG. 9 and at a subsequent fabrication stage of the processing method, lower source/drain contacts 52 are formed that are coupled with the 2D semiconducting material in the layer 46 and, by extension, that are coupled by the layer 46 with the 2D semiconducting material in the replacement channel layers 44. The lower source/drain contacts 52 may contain a conductor, such as a metal like tungsten (W) or titanium nitride (TiN), that is deposited and recessed with an etch-back process. The 2D semiconducting material in the layer 46, which may be doped, has a U-shape with vertical sections joined by a lower horizontal section on the dielectric layer 18 and wraps around the conductor contained in each lower source/drain contact 52. This relationship maximizes the contact area, which may reduce the source/drain contact resistance.

The layer 46 may be chamfered, after forming the lower source/drain contacts 52, using an isotropic etching process to provide the interconnected horizontal and vertical sections of 2D semiconducting material. Each grouping of interconnected horizontal and vertical sections of 2D semiconducting material provides a source/drain region of the nanosheet field-effect transistor. As used herein, the term "source/drain region" means interconnected horizontal and vertical sections of the 2D semiconducting material that can function as either a source or a drain of a nanosheet field-effect transistor.

Figure 11:
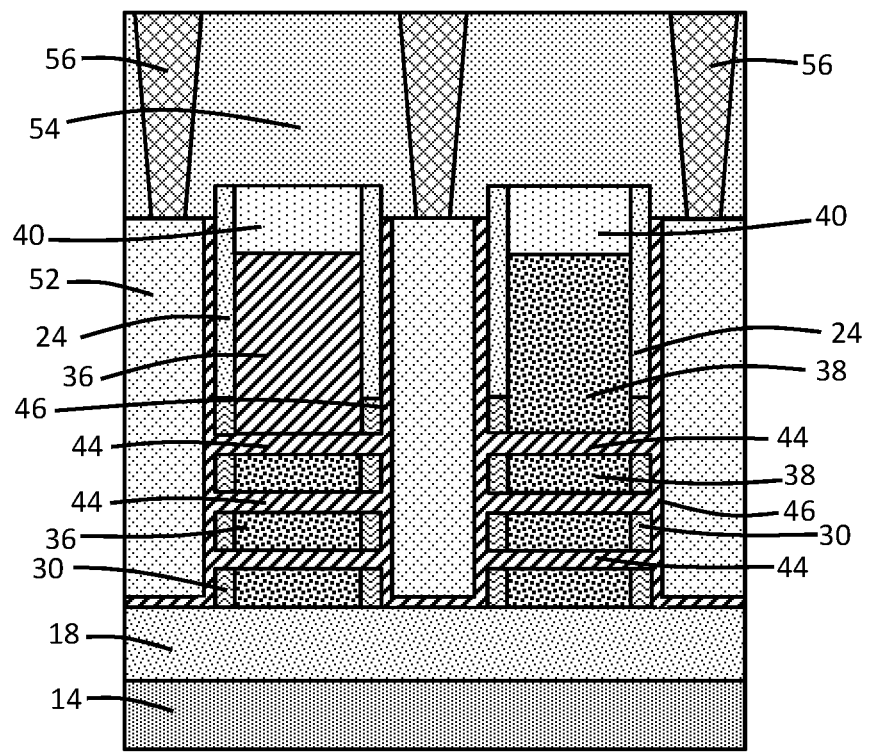

With reference to FIG. 11 in which like reference numerals refer to like features in FIG. 10 and at a subsequent fabrication stage of the processing method, an interlayer dielectric layer 54 is deposited and planarized by chemical mechanical polishing (CMP). The interlayer dielectric layer 54 may be composed of a dielectric material, such as silicon dioxide ($SiO_2$). Upper contacts 56, which may be composed of a metal (e.g., tungsten (W)), are formed inside contact openings etched in the interlayer dielectric layer 54 and extend vertically through the interlayer dielectric layer 54 to contact the lower source/drain contacts 52.

The completed nanosheet field-effect transistor includes replacement channel layers 44 containing 2D semiconducting material, instead of a semiconductor material (e.g., silicon) that provides the channel layer of a conventional nanosheet field-effect transistor. The substitution of the 2D semiconducting material may be effective to improve electrostatic control, and may permit further gate length scaling and contacted (poly) pitch (CPP) scaling. The arrangement of the layer 46 and the lower source/drain contacts 52 provides a wrap-around-contact (WAC) that may improve contact resistance. Because the source/drain regions do not contain an epitaxial semiconductor material as in conventional nanosheet field-effect transistors, the nanosheet field-effect transistor including the replacement channel layers 44 of 2D semiconducting material is junction-less. Either n-type or p-type nanosheet field-effect transistors may be formed by adjusting the doping of the 2D semiconducting material in layer 46 and the metal used to form the lower source/drain contacts 52.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a field-effect transistor, the structure comprising:
   a plurality of channel layers arranged in a layer stack;
   a source/drain region connected with the plurality of channel layers; and
   a gate structure including a plurality of sections that respectively surround the plurality of channel layers,
   wherein the plurality of channel layers are comprised of a two-dimensional semiconducting material, and the source/drain region is comprised of the two-dimensional semiconducting material.

2. The structure of claim 1 wherein the two-dimensional semiconducting material is a transition metal dichalcogenide.

3. The structure of claim 1 wherein the two-dimensional semiconducting material is molybdenum disulphide, hafnium disulfide, zirconium disulfide, tungsten disulfide, tin sulfide, or tungsten diselenide.

4. The structure of claim 1 wherein the two-dimensional semiconducting material is graphene.

5. The structure of claim 1 wherein the two-dimensional semiconducting material of the source/drain region contains a dopant effective to increase an electrical conductivity of the two-dimensional semiconducting material of the source/drain region.

6. The structure of claim 1 further comprising:
a contact coupled with the two-dimensional semiconducting material of the source/drain region.

7. The structure of claim 6 wherein the two-dimensional semiconducting material of the source/drain region contains a dopant effective to increase electrical conductivity.

8. The structure of claim 1 wherein each channel layer includes a first section and a second section that are separated by an air gap.

9. The structure of claim 1 wherein each channel layer includes a first section and a second section spaced from the first section, and the structure further comprising:
a dielectric layer arranged between the first section and the second section of each channel layer.

10. The structure of claim 1 wherein each channel layer has a thickness of one nanometer to three nanometers.

11. The structure of claim 1 wherein each channel layer is a sheet including a monolayer of atoms.

12. A method of forming a field-effect transistor, the method comprising:
forming a plurality of nanosheet channel layers arranged in a layer stack;
forming a gate structure including a plurality of sections that respectively surround the plurality of nanosheet channel layers;
after forming the gate structure, removing the plurality of nanosheet channel layers to form a plurality of spaces between the plurality of sections of the gate structure; and
depositing a two-dimensional semiconducting material in the plurality of spaces between the plurality of sections of the gate structure to form a plurality of replacement channel layers.

13. The method of claim 12 wherein the two-dimensional semiconducting material is a transition metal dichalcogenide.

14. The method of claim 12 wherein the two-dimensional semiconducting material is deposited as a conformal coating on a sidewall of the layer stack to provide a source/drain region that is connected with the plurality of replacement channel layers.

15. The method of claim 14 further comprising:
introducing a dopant by a plasma doping process into the two-dimensional semiconducting material of the source/drain region that is effective to increase an electrical conductivity of the two-dimensional semiconducting material of the source/drain region.

16. The method of claim 15 further comprising:
forming a contact coupled with the two-dimensional semiconducting material of the source/drain region.

17. The method of claim 12 wherein each space is partially filled by a first section and a second section of the two-dimensional semiconducting material, and an air gap is arranged in a portion of each space between the first section and the second section of the two-dimensional semiconducting material.

18. The method of claim 12 wherein each space is partially filled by a first section and a second section of the two-dimensional semiconducting material, and the method further comprises:
depositing a dielectric layer in a portion of each space that is arranged between the first section and the second section of the two-dimensional semiconducting material.

19. The method of claim 12 wherein each channel layer is a sheet including a monolayer of atoms.

20. The structure of claim 1 wherein the layer stack has a sidewall, and the two-dimensional semiconducting material of the source/drain region is arranged as a conformal coating on the sidewall of the layer stack.

* * * * *